(12) United States Patent
Tanaka et al.

(10) Patent No.: US 11,574,998 B2
(45) Date of Patent: Feb. 7, 2023

(54) SEMICONDUCTOR DEVICE AND MANUFACTURING METHOD THEREOF

(71) Applicant: Mitsubishi Electric Corporation, Tokyo (JP)

(72) Inventors: Koji Tanaka, Tokyo (JP); Koichi Nishi, Tokyo (JP); Ze Chen, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/350,051

(22) Filed: Jun. 17, 2021

(65) Prior Publication Data
US 2022/0208962 A1 Jun. 30, 2022

(30) Foreign Application Priority Data
Dec. 28, 2020 (JP) .............................. JP2020-218320

(51) Int. Cl.
*H01L 29/06* (2006.01)
*H01L 29/739* (2006.01)
(Continued)

(52) U.S. Cl.
CPC .... *H01L 29/0615* (2013.01); *H01L 21/26513* (2013.01); *H01L 29/7397* (2013.01); *H01L 29/8613* (2013.01)

(58) Field of Classification Search
CPC ........... H01L 29/0615; H01L 21/26513; H01L 29/7397; H01L 29/8613; H01L 29/0603;
(Continued)

(56) References Cited

U.S. PATENT DOCUMENTS

| 8,084,814 B2 * | 12/2011 | Nemoto | ................ | H01L 21/263 |
| | | | | 257/E29.198 |
| 2009/0184340 A1 | 7/2009 | Nemoto et al. | | |
| 2014/0299915 A1 | 10/2014 | Kouno et al. | | |

FOREIGN PATENT DOCUMENTS

| JP | 2009-176892 A | 8/2009 |
| JP | 2013-138172 A | 7/2013 |
| JP | 2020-107917 A | 7/2020 |

* cited by examiner

*Primary Examiner* — David Vu
(74) *Attorney, Agent, or Firm* — Studebaker & Brackett PC

(57) ABSTRACT

A semiconductor device includes: a semiconductor substrate including a front surface, a back surface that is opposite to the front surface, and a drift layer of a first conductive type disposed between the front surface and the back surface; a first diffusion layer of a second conductive type provided between the drift layer and the front surface; a second diffusion layer provided between the drift layer and the back surface; a first buffer layer of the first conductive type provided between the drift layer and the second diffusion layer, having a concentration higher than that of the drift layer, and into which a proton is injected; and a second buffer layer of the first conductive type provided between the first buffer layer and the second diffusion layer and having a concentration higher than that of the drift layer, wherein a peak concentration of the second buffer layer is higher than a peak concentration of the first buffer layer, an impurity concentration of the first buffer layer gradually decreases toward the back surface, a length from a peak position of the first buffer layer to a boundary between the drift layer and the first buffer layer is represented by Xa, a length from the peak position to a boundary between the first buffer layer and the second buffer layer is represented by Xb, and Xb>5 Xa.

14 Claims, 6 Drawing Sheets

(51) Int. Cl.
*H01L 21/265* (2006.01)
*H01L 29/861* (2006.01)

(58) Field of Classification Search
CPC . H01L 29/36; H01L 29/66136; H01L 29/861; H01L 21/26506
See application file for complete search history.

SEMICONDUCTOR DEVICE AND MANUFACTURING METHOD THEREOF

BACKGROUND OF THE INVENTION

Field

The present disclosure relates to a semiconductor device and a manufacturing method thereof.

Background

When a reverse bias is applied to a vertical semiconductor device, a depletion layer extends toward a back surface from an interface between a P-type region and an N-type drift layer that are formed on the front surface of a substrate. There is a technique in which a surge voltage generated in a turned-off state is suppressed by forming a buffer layer to stop the depletion layer at a predetermined depth (e.g., see JP 2009-176892 A).

SUMMARY

If a donor layer cannot be fully formed on the back surface of a deep buffer layer, a defect region is generated. In the related art, multi-stage injection or high-concentration injection is carried out to prevent formation of such a defect region, which leads to deterioration in productivity. In addition, the depletion layer is stopped in the deep buffer layer, which leads to a reduction in withstand voltage.

The present disclosure has been made to solve the above-described problem, and an object of the present disclosure is to obtain a semiconductor device that has a high withstand voltage, is excellent in productivity, and is capable of suppressing a surge voltage in a recovery state or turned-off state, and a manufacturing method thereof.

A semiconductor device according to the present disclosure includes: a semiconductor substrate including a front surface, a back surface that is opposite to the front surface, and a drift layer of a first conductive type disposed between the front surface and the back surface; a first diffusion layer of a second conductive type provided between the drift layer and the front surface; a second diffusion layer provided between the drift layer and the back surface; a first buffer layer of the first conductive type provided between the drift layer and the second diffusion layer, having a concentration higher than that of the drift layer, and into which a proton is injected; and a second buffer layer of the first conductive type provided between the first buffer layer and the second diffusion layer and having a concentration higher than that of the drift layer, wherein a peak concentration of the second buffer layer is higher than a peak concentration of the first buffer layer, an impurity concentration of the first buffer layer gradually decreases toward the back surface, a length from a peak position of the first buffer layer to a boundary between the drift layer and the first buffer layer is represented by Xa, a length from the peak position to a boundary between the first buffer layer and the second buffer layer is represented by Xb, and Xb>5 Xa.

In the present disclosure, the high-concentration second buffer layer is provided between the first buffer layer and the second diffusion layer. A length from a peak position of the first buffer layer to a boundary between the drift layer and the first buffer layer is represented by Xa, a length from the peak position to a boundary between the first buffer layer and the second buffer layer is represented by Xb, and Xb>5 Xa. Therefore, it is possible to obtain a semiconductor device that has a high withstand voltage, is excellent in productivity, and is capable of suppressing a surge voltage in a recovery state or turned-off state.

Other and further objects, features and advantages of the invention will appear more fully from the following description.

DESCRIPTION OF EMBODIMENTS

Figure 1:
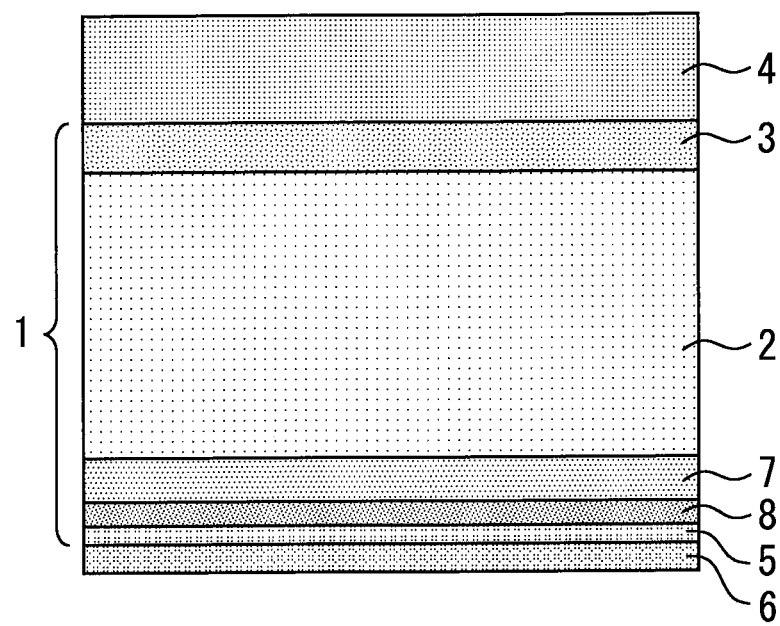
FIG. 1 is a sectional view illustrating a semiconductor device according to an embodiment.

FIG. 1 is a sectional view illustrating a semiconductor device according to an embodiment. This semiconductor device is a diode with a withstand voltage of 4500 V. FIG. 1 is a sectional view illustrating a diode cell portion. A semiconductor substrate 1 is a silicon substrate including a front surface, a back surface that is opposite to the front surface, and an n-type drift layer 2 disposed between the front surface and the back surface. The thickness of the semiconductor substrate 1 is, for example, 430 to 530 μm. In a diode with a withstand voltage of 4500 V, the impurity concentration of the drift layer 2 is, for example, 7.0E12 to 2.0E13 cm$^{-3}$. The drift layer 2 includes impurities of phosphorus (P), arsenic (As), or antimony (Sb).

A p-type anode layer 3 is provided between the drift layer 2 and the front surface of the semiconductor substrate 1. The anode layer 3 includes impurities of boron (B) or aluminum (Al). An anode electrode 4 is provided on the front surface of the semiconductor substrate 1, and is connected to the anode layer 3.

An N-type cathode layer 5 is provided between the drift layer 2 and the back surface of the semiconductor substrate 1. The cathode layer 5 includes impurities of phosphorus (P)

or arsenic (As). A cathode electrode 6 is provided on the back surface of the semiconductor substrate 1, and is connected to the cathode layer 5.

An N-type first buffer layer 7 is provided between the drift layer 2 and the cathode layer 5. The first buffer layer 7 is a donor layer formed by injecting protons by annealing, and has a concentration higher than that of the drift layer 2. An n-type second buffer layer 8 is provided between the first buffer layer 7 and the cathode layer 5. The second buffer layer 8 is a donor layer formed by annealing after phosphorus ions are injected, and has a concentration higher than that of the drift layer 2.

Figure 2:
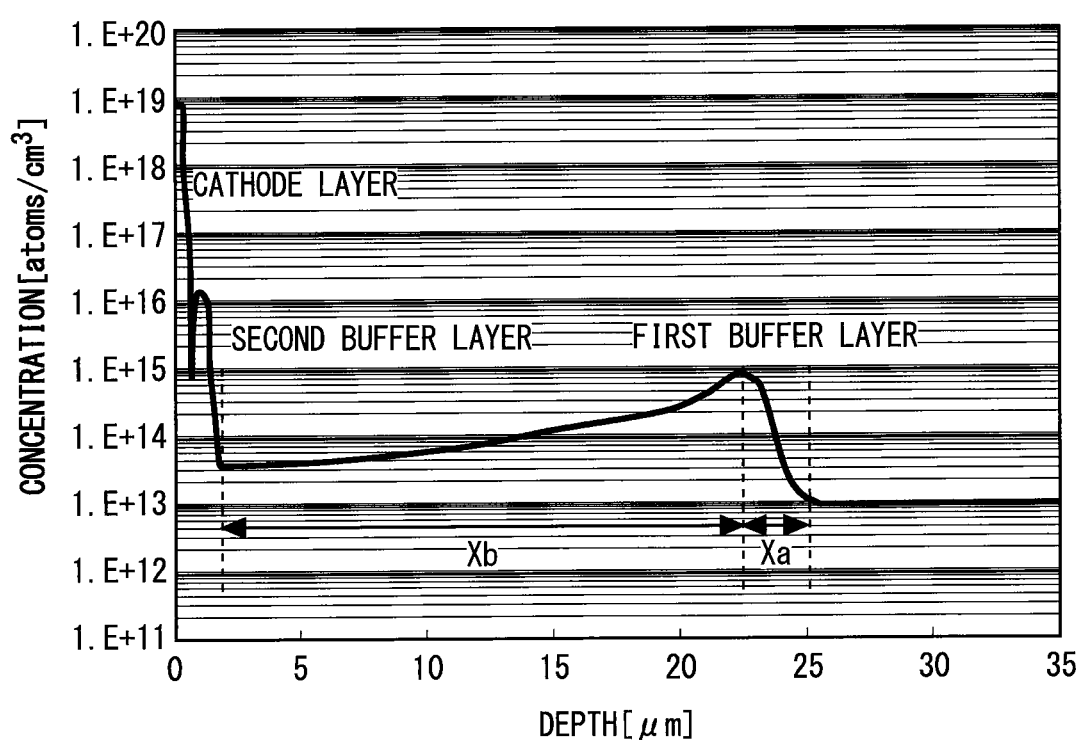
FIG. 2 is a graph illustrating an impurity concentration profile on the back surface of the semiconductor device according to the embodiment.

FIG. 2 is a graph illustrating an impurity concentration profile on the back surface of the semiconductor device according to the embodiment. A peak concentration of the first buffer layer 7 is 1E15 cm$^{-3}$ or less. A peak position corresponding to the position of the peak concentration of the first buffer layer 7 is in a depth range of 10 to 30 µm from the back surface. A peak position of the second buffer layer 8 is in a depth range of 0.5 to 3.0 µm from the back surface. A peak concentration of the second buffer layer 8 is higher than the peak concentration of the first buffer layer 7. The impurity concentration of the first buffer layer 7 gradually decreases toward the back surface.

In the present embodiment, the impurity concentration distribution is set to satisfy Xb>5 Xa, assuming that the length from the peak position of the first buffer layer 7 to a boundary between the drift layer 2 and the first buffer layer 7 is represented by Xa and the length from the peak position to a boundary between the first buffer layer 7 and the second buffer layer 8 is represented by Xb. A larger amount of hydrogen is supplied from the peak position of the first buffer layer 7 to the back surface, thereby preventing a defect region from being generated when the first buffer layer 7 cannot be fully formed into a donor layer. Further, it is possible to prevent a defect region from being generated even when the drift layer 2 has a low concentration. Accordingly, the first buffer layer 7 can be formed to a deep position without carrying out multi-stage injection or high-concentration injection, the productivity of injection can be improved.

Figure 3:
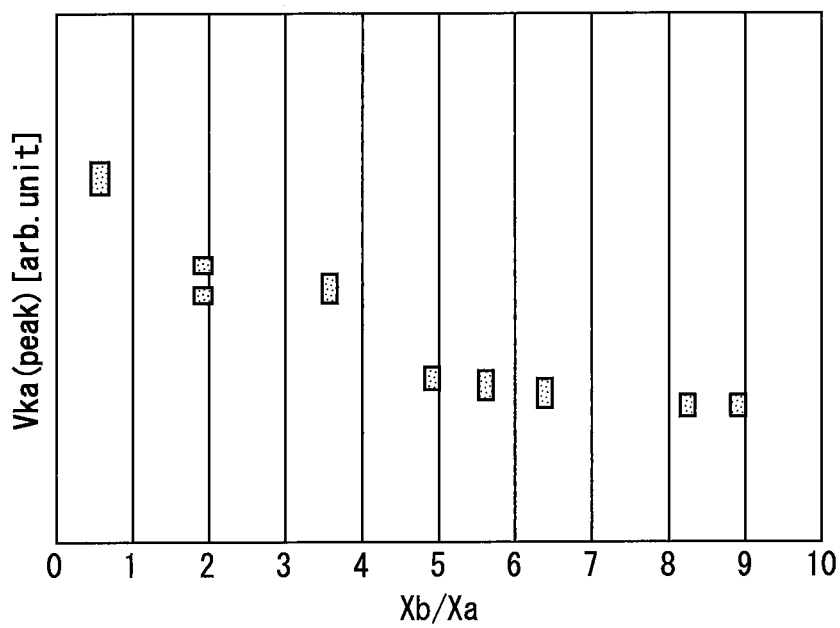
FIG. 3 is a graph illustrating a Xb/Xa dependence of a surge voltage Vka during recovery.

As seen from the impurity profile result, it is assumed that an acceptor is present in the defect region, the defect region corresponds to an acceptor region. Accordingly, the high-concentration second buffer layer 8 is provided between the first buffer layer 7 and the cathode layer 5. The second buffer layer 8 brings a defect layer, which has a size of about several µm and is formed on the back surface, into a donor layer, thereby cancelling out the defect region. Accordingly, even when the impurity concentration of the first buffer layer 7 is decreased, the defect region is less likely to be generated. Therefore the impurity concentration of the first buffer layer 7 can be reduced, and thus the depletion layer can be gradually stopped. As a result, a surge voltage to be generated during recovery can be suppressed and the withstand voltage can be improved. FIG. 3 is a graph illustrating a Xb/Xa dependence of a surge voltage Vka during recovery. It is obvious that the surge voltage can be suppressed when Xb>5Xa is satisfied.

A value of an electric field strength at which avalanche breakdown occurs is referred to as a critical field strength. The avalanche breakdown is dependent on elements of semiconductor, impurities doped in semiconductor, and impurity concentration. Assuming that the donor concentration is represented by $N_D$ and the critical field strength is represented by $E_C$, when ionization integration is performed using impact ionization coefficients of silicon, a critical field strength $E_C$ is expressed by Math. 1.

$$Ec = 4010 \cdot (N_D)^{1/8} \qquad \text{[Math. 1]}$$

As seen from Math. 1, if the donor concentration $N_D$ is determined, the critical field strength $E_C$ is determined. When only the one-dimensional direction (only x-direction) is taken into consideration, the Poisson's formula is expressed by Math. 2.

$$dE/dx = (q/\varepsilon_r\varepsilon_0)(p - n + N_D - N_A) \qquad \text{[Math. 2]}$$

In Math. 2, q represents an elementary charge (1.062× 10$^{15}$ [C]), ε0 represents a vacuum dielectric constant (8.854×10$^{-14}$ [F/cm]), and εr represents a relative dielectric constant of a material. In the case of silicon, εr=11.9. p represents a hole concentration, n represents an electron concentration, and $N_A$ represents an acceptor concentration. Assume that since only the n-type layer is taken into consideration in one-sided abrupt junction, no acceptor is present ($N_A$=0). In addition, assuming that a depletion layer that is completely depleted (n=p=0), leaving no holes and no electrons, is formed, when Math. 2 is integrated by the depth x, Math. 3 is obtained.

$$E = (q/\varepsilon_r\varepsilon_0)\int N_D dx \qquad \text{[Math. 3]}$$

A position for pn-junction is set as an origin 0, and a position of an end of the depletion layer at a position on the opposite side of the pn-junction in the n-type layer is represented by xo. When the entire depletion layer is integrated by 0 to xo, E in Math. 3 is a maximum value in the field strength distribution. When the maximum value is represented by $E_m$, $E_m$ is expressed by Math. 4.

$$E_m = (q/\varepsilon_r\varepsilon_0)\int_0^{x_0} N_D dx \qquad \text{[Math. 4]}$$

Assuming that the maximum value $E_m$ in the field strength distribution reaches the critical field strength $E_C$, Math. 4 is expressed by Math. 5.

$$E_c(\varepsilon_r\varepsilon_0/q) = \int_0^{x_0} N_D dx \qquad \text{[Math. 5]}$$

Both sides of Math. 5 represent constants. The right side of Math. 5 represents the completely depleted range in the n-type layer, and this range is referred to as a critical integration concentration $n_C$. Thus, the following Math. 6 is obtained. Math. 6 represents the correspondence between the critical integration concentration $n_C$ and the critical field strength $E_C$. In this manner, the critical integration concentration $n_C$ becomes the value corresponding to the critical field strength $E_C$. When the value is substituted in this case, the critical integration concentration $n_C$ is expressed as n=6.52 E06×$E_C$.

$$E_c(\varepsilon_r\varepsilon_0/q) = n_c \qquad \text{[Math. 6]}$$

Figure 4:
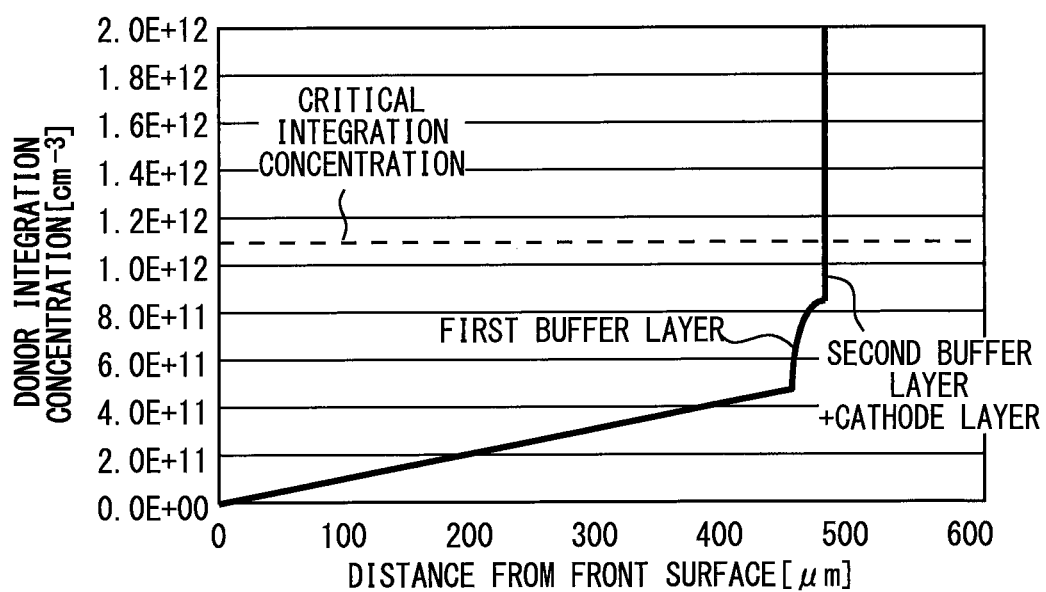
FIG. 4 is a graph illustrating results of integration of the donor concentration from the front surface of the semiconductor substrate to the back surface thereof.

FIG. 4 is a graph illustrating results of integration of the donor concentration from the front surface of the semiconductor substrate to the back surface thereof. At the positions of the drift layer 2 and the first buffer layer 7, the concentration is less than or equal to the critical integration concentration, and at the position of at least the peak concentration of the second buffer layer 8, the concentration is more than or equal to the critical integration concentration. Thus, the positions where the critical integration concentration is reached or exceeded is set to be in the second buffer layer 8, so that the depletion layer extends to position of the second buffer layer 8. This leads to an improvement in withstand voltage and a reduction in leak current.

Figure 5:
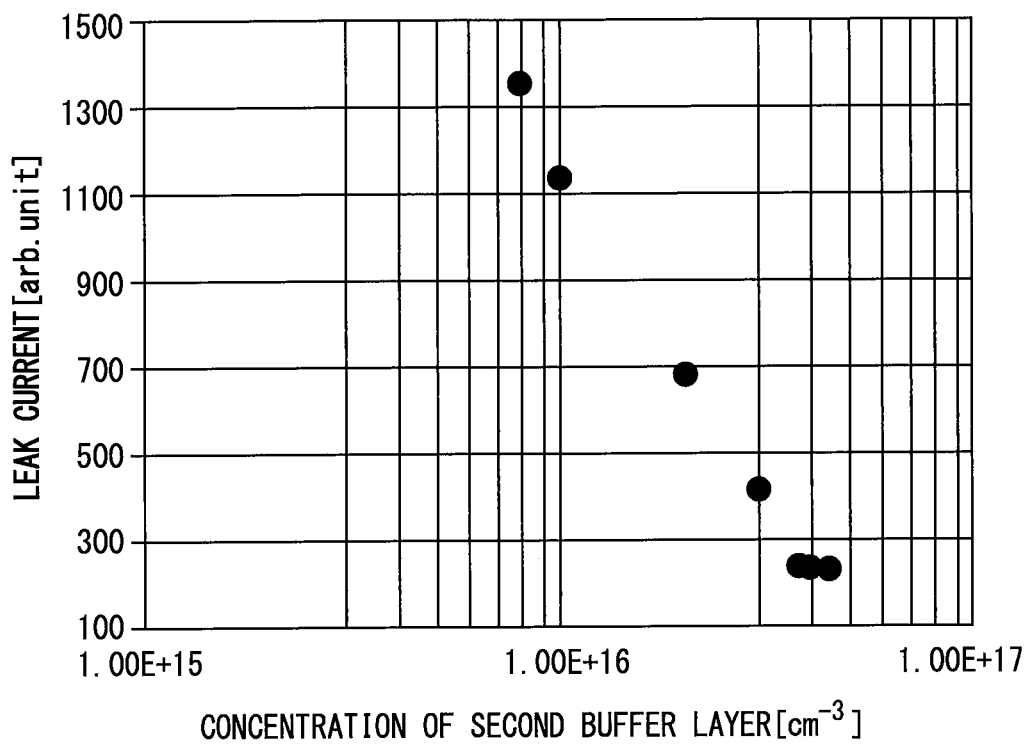
FIG. 5 is a graph illustrating the dependence of a leak current of the diode on the concentration of the second buffer layer.

FIG. 5 is a graph illustrating the dependence of a leak current of the diode on the concentration of the second buffer layer. The leak current can be reduced by increasing the impurity concentration of the second buffer layer 8. The impurity concentration of the second buffer layer 8 may be preferably more than or equal to $2E16$ $cm^{-3}$, and more preferably, more than or equal to $4E16$ $cm^{-3}$.

Figure 6:
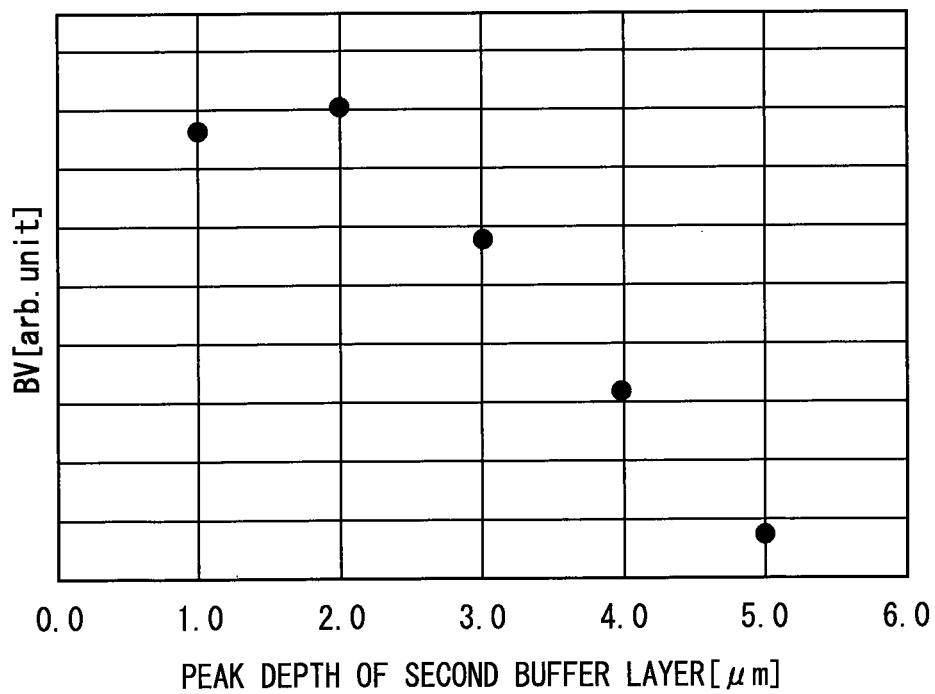
FIG. 6 illustrates simulation results of the dependence of a withstand voltage BV on the peak depth of the second buffer layer.

FIG. 6 illustrates simulation results of the dependence of a withstand voltage BV on the peak depth of the second buffer layer. The depth of the peak concentration of the second buffer layer 8 from the back surface is referred to as a peak depth. The depletion layer is fully extended in the thickness direction as the peak depth decreases. Accordingly, the withstand voltage BV can be improved. The peak depth of the second buffer layer 8 may be preferably 2 μm or less.

The impurity concentration at the boundary between the first buffer layer 7 and the second buffer layer 8 is a minimum value. This minimum value may be preferably more than or equal to the impurity concentration of the drift layer 2. Thus, when the donor concentration of each of the first buffer layer 7 and the second buffer layer 8 is increased, the effect of stopping the depletion layer is increased and the surge voltage to be generated during recovery can be suppressed.

When the donor concentration of the first buffer layer 7 is reduced, a defect is more likely to occur in a region from the peak position of the first buffer layer 7 to the back surface. On the other hand, when the donor concentration of the first buffer layer 7 is gradually decreased toward the back surface, a defect is less likely to occur in this region and the withstand voltage can be improved. Specifically, the donor concentration of up to 0.3 Xb in the region from the peak position of the first buffer layer 7 to the back surface may be preferably more than or equal to 10% of the peak concentration of the first buffer layer 7.

The impurity concentration of the drift layer 2 may be preferably in a range from $3E13$ to $3E14$ $cm^{-3}$, and the peak position of the first buffer layer 7 may be preferably present in in a range from 15 to 25 μm. Alternatively, the impurity concentration of the drift layer 2 may be preferably in a range from $1E12$ to $3E13$ $cm^{-3}$, and the peak position of the first buffer layer 7 may be preferably present in a range from 20 to 30 μm. When the impurity concentration of the drift layer 2 and the peak position of the first buffer layer 7 are set as described above, a defect is less likely to occur even when the impurity concentration of the first buffer layer 7 is decreased, and thus the depletion layer can be gradually stopped.

Next, a method for forming the diffusion layer on the back surface of the semiconductor device according to the present embodiment will be described. First, an impurity is injected into the back surface of the semiconductor substrate 1, thereby forming the cathode layer 5. Next, protons are injected into a space between the drift layer 2 and the cathode layer 5, thereby forming the first buffer layer 7. Next, an impurity is injected into a space between the first buffer layer 7 and the cathode layer 5. Next, the cathode layer 5 and the second buffer layer 8 are activated by laser heat. Next, the first buffer layer 7 is formed into a donor layer by furnace anneal.

In this case, protons are activated in a range from about 350 to 500° C., and when the temperature exceeds this temperature range, protons anneal out and the donor layer disappears. However, at a low temperature of 350° C., the activation speed is low and the annealing processing time increases, which is not suitable for mass production. At a high temperature of 500° C., the activation speed is high and thus it is difficult to control a variation in the wafer surface or a lot-to-lot variation. Accordingly, a furnace annealing temperature is set in a range from 400 to 450° C.

In addition, a crystal defect occurs on the back surface corresponding to a region through which protons pass. This crystal defect induces formation of a donor layer during annealing. Accordingly, as for the impurity concentration of the first buffer layer 7, a distribution as represented by Xb>5Xa is obtained, in which the slope is gentle on the back surface and the slope is steep on the front surface. However, when the furnace annealing process time is increased, the diffusion range increases, and it may be desirable to carry out the annealing process for two hours or longer so as to increase the area of the gentle slope on the back surface.

If the formation of a donor layer on the back surface of the first buffer layer 7 is not advanced, a defect region is generated. On the other hand, when the semiconductor substrate 1 has a lower impurity concentration and the range in which protons are injected decreases, the defect region is less likely to be generated. Specifically, when the impurity concentration of the semiconductor substrate 1 is in a range from $3E13$ to $3E14$ $cm^{-3}$, the range of protons is set in a range from 15 to 25 μm, and when the impurity concentration of the semiconductor substrate 1 is in a range from $1E12$ to $3E13$ $cm^{-3}$, the range of protons is set in a range from 20 to 30 μm, thereby obtaining the concentration distribution of Xb>5Xa.

Figure 7:
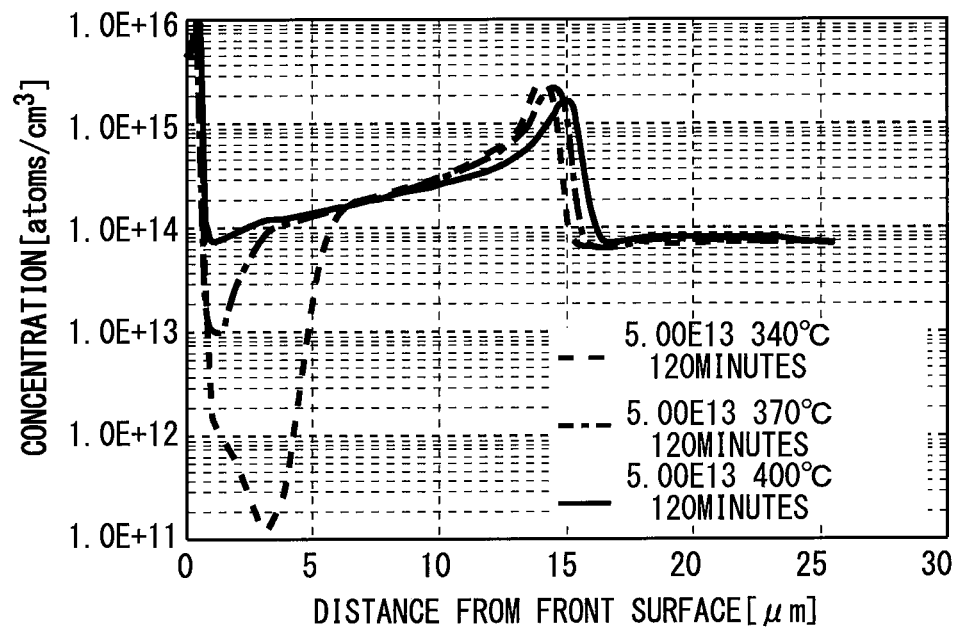
FIG. 7 is a graph illustrating the impurity concentration profile, resulting from each activation annealing temperature, of the first buffer layer 7 in the 1200 V-class diode.

FIG. 7 is a graph illustrating the impurity concentration profile, resulting from each activation annealing temperature, of the first buffer layer in the 1200 V-class diode. Three activation annealing temperatures set for the first buffer layer 7 are 340° C., 370° C., and 400° C. The annealing time is 120 minutes. When the activation annealing temperature is low, the leak current increases due to the formation of the defect region on the back surface. Accordingly, the minimum value of the impurity concentration at the boundary between the first buffer layer 7 and the second buffer layer 8 may be desirably more than or equal to the impurity concentration of the drift layer 2. When the activation annealing temperature of the first buffer layer 7 is set to 400° C. or higher, the formation of the defect region on the back surface can be prevented.

Figure 8:
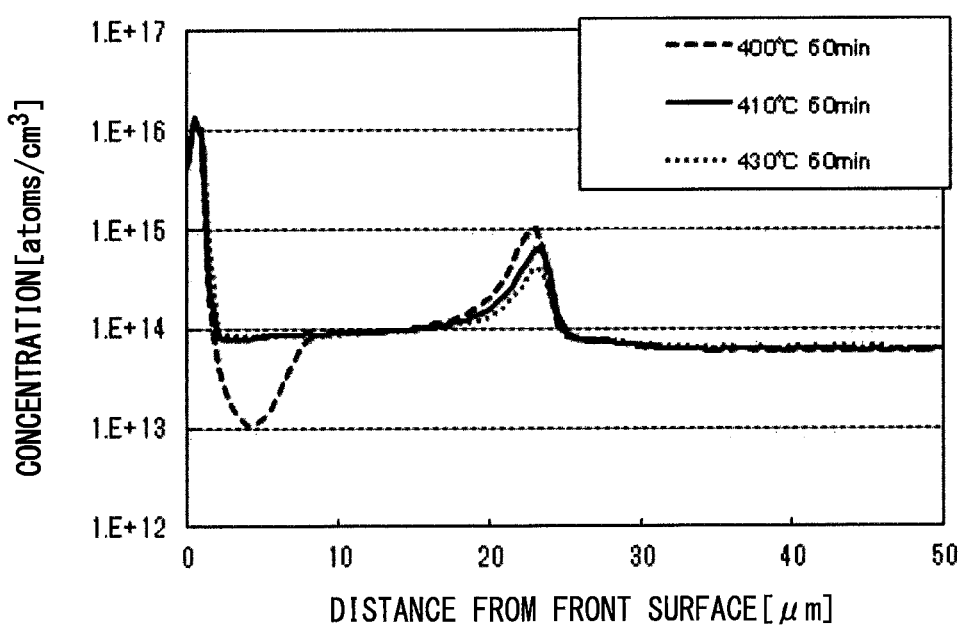
FIG. 8 is a graph illustrating the impurity concentration profile, resulting from each activation annealing temperature, of the first buffer layer 7 in the 1200 V-class diode.

The productivity can also be improved by reducing the annealing time. FIG. 8 is a graph illustrating the impurity concentration profile, resulting from each activation annealing temperature, of the first buffer layer 7 in the 1200 V-class diode. Three activation annealing temperatures set for the first buffer layer 7 are 400° C., 410° C., and 430° C. The annealing time is 60 minutes. When the activation annealing temperature is low, the leak current increases due to the formation of the defect region on the back surface. When the activation annealing temperature of the first buffer layer 7 is set to 410° C. or higher, the formation of the defect region on the back surface can be prevented. Accordingly, the minimum value of the impurity concentration at the boundary between the first buffer layer 7 and the second buffer layer 8 may be desirably more than or equal to the impurity concentration of the drift layer 2.

Figure 9:
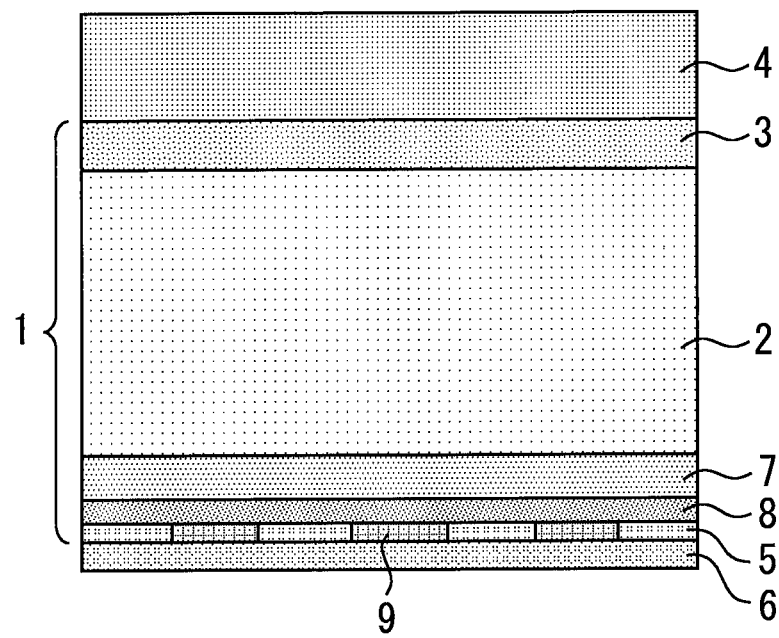
FIG. 9 is a sectional view illustrating Modified Example 1 of the semiconductor device according to the embodiment.

FIG. 9 is a sectional view illustrating Modified Example 1 of the semiconductor device according to the embodiment. This semiconductor device is a diode with a withstand voltage of 4500 V. On the back surface of the semiconductor substrate 1, the N-type cathode layer 5 and a back surface p-type layer 9 are alternately formed side by side. The impurity concentration of the drift layer 2 is about 1E13 $cm^{-3}$.

Figure 10:
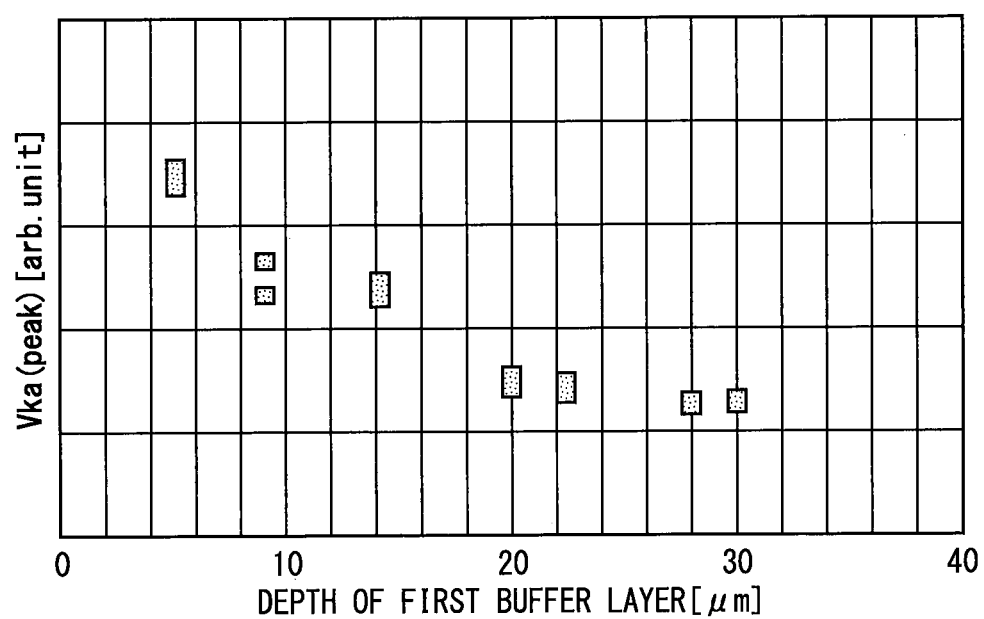
FIG. 10 is a graph illustrating measurement results of the dependence of the surge voltage Vka during recovery of the diode illustrated in FIG. 9 on the depth of the first buffer layer.

FIG. 10 is a graph illustrating measurement results of the dependence of the surge voltage Vka during recovery of the diode illustrated in FIG. 9 on the depth of the first buffer layer. When the first buffer layer 7 is shallower, the efficiency of hole injection from the back surface p-type layer 9 decreases. Accordingly, the electric field strength on the back surface increases and the surge voltage to be generated during recovery increases. However, when the first buffer layer 7 is extremely deep, the withstand voltage decreases and the defect region is generated. Accordingly, the depth of the first buffer layer 7 may be desirably in a range from 10 to 30 μm at which the surge voltage to be generated during recovery decreases, and more desirably, in a range from 20 to 30 μm.

Figure 11:
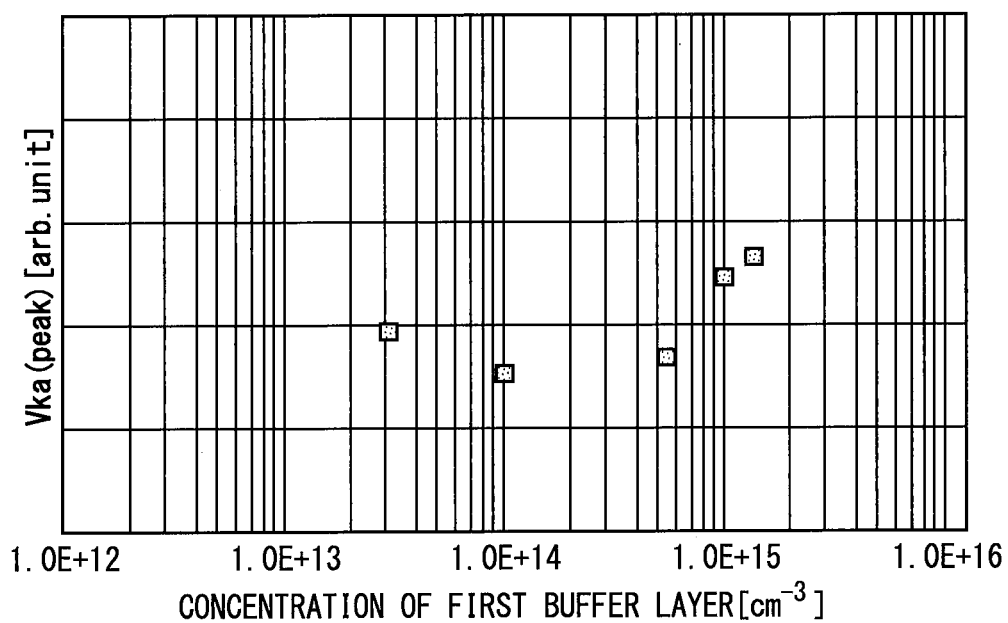
FIG. 11 is a graph illustrating the dependence of the surge voltage during recovery of the diode illustrated in FIG. 9 on the concentration of the first buffer layer.

FIG. 11 is a graph illustrating the dependence of the surge voltage during recovery of the diode illustrated in FIG. 9 on the concentration of the first buffer layer. When the impurity concentration of the first buffer layer 7 is high, the efficiency of hole injection from the back surface p-type layer 9 decreases. Accordingly, the electric field strength on the back surface increases and the surge voltage to be generated during recovery increases. Accordingly, the peak concentration of the first buffer layer 7 may be desirably 1E15 $cm^{-3}$ or less. However, when the impurity concentration of the first buffer layer 7 is extremely low, the efficiency of the first buffer layer 7 to stop the depletion layer decreases. Accordingly, the peak concentration of the first buffer layer 7 may be more desirably in a range from 1E14 $cm^{-3}$ to 1E15 $cm^{-3}$.

Figure 12:
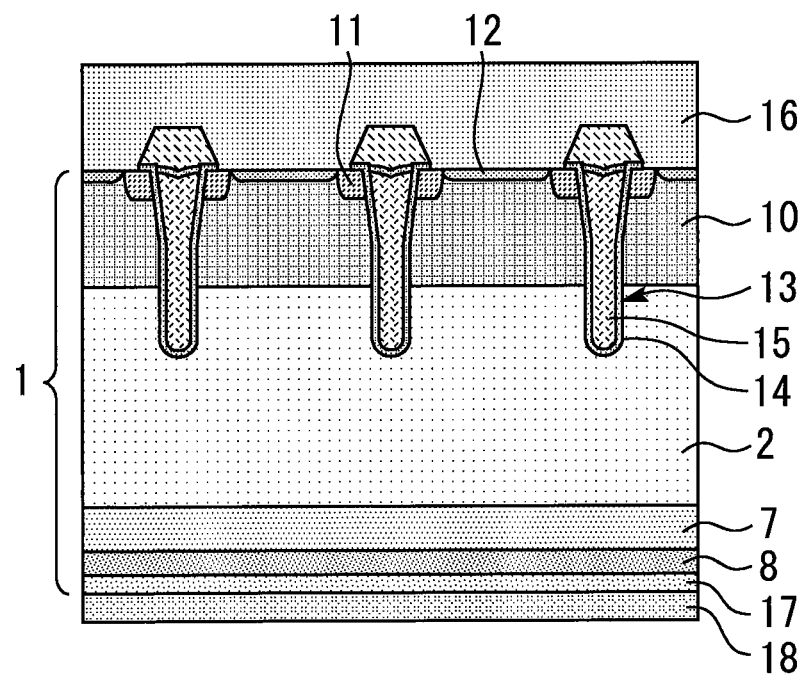
FIG. 12 is a sectional view illustrating Modified Example 2 of the semiconductor device according to the embodiment.

FIG. 12 is a sectional view illustrating Modified Example 2 of the semiconductor device according to the embodiment. This semiconductor device is an insulating gate-type bipolar transistor (IGBT). FIG. 12 is a sectional view illustrating an IGBT cell portion. A p-type base layer 10 is provided on the front surface of the semiconductor substrate 1. An $n^+$-type emitter layer 11 and a $p^+$-type contact layer 12 are provided on the front surface of the base layer 10. Trenches 13 are formed such that the trenches 13 penetrate through the $n^+$-type emitter layer 11 and the base layer 10. In each of the trenches 13, a gate electrode 15 is formed through an insulating film 14. An emitter electrode 16 is provided on the front surface of the semiconductor substrate 1. A p-type collector layer 17 and a collector electrode 18 are provided on the back surface of the semiconductor substrate 1. The configuration of each of the first buffer layer 7 and the second buffer layer 8 is similar to that of the diode illustrated in FIG. 1, and the operation and effects of the first buffer layer 7 and the second buffer layer 8 are also similar to those of the diode illustrated in FIG. 1. In this configuration, however, it is possible to suppress a surge voltage to be generated in a turned-off state, instead of suppressing a surge voltage to be generated during recovery. Note that an $n^+$-type layer may be provided below the p-type base layer 10, and the semiconductor device may be a reverse conductive IGBT including an IGBT region and a diode region.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2020-218320, filed on Dec. 28, 2020 including specification, claims, drawings and summary, on which the convention priority of the present application is based, is incorporated herein by reference in its entirety.

The invention claimed is:

1. A semiconductor device comprising:
   a semiconductor substrate including a front surface, a back surface that is opposite to the front surface, and a drift layer of a first conductive type disposed between the front surface and the back surface;
   a first diffusion layer of a second conductive type provided between the drift layer and the front surface;
   a second diffusion layer provided between the drift layer and the back surface;
   a first buffer layer of the first conductive type provided between the drift layer and the second diffusion layer, having a concentration higher than that of the drift layer, and into which a proton is injected; and
   a second buffer layer of the first conductive type provided between the first buffer layer and the second diffusion layer and having a concentration higher than that of the drift layer,
   wherein a peak concentration of the second buffer layer is higher than a peak concentration of the first buffer layer,
   an impurity concentration of the first buffer layer gradually decreases toward the back surface,
   a length from a peak position of the first buffer layer to a boundary between the drift layer and the first buffer layer is represented by Xa,
   a length from the peak position to a boundary between the first buffer layer and the second buffer layer is represented by Xb, and
   Xb>5 Xa.

2. The semiconductor device according to claim 1, wherein the second diffusion layer includes a p-type layer, and
   the peak position of the first buffer layer is in a depth range of 10 to 30 μm from the back surface.

3. The semiconductor device according to claim 1, wherein the second diffusion layer includes a p-type layer, and
   a peak concentration of the first buffer layer is 1E15 $cm^{-3}$ or less.

4. The semiconductor device according to claim 1, wherein a donor impurity concentration integrated from the front surface to the back surface is less than or equal to a critical integration concentration in the drift layer and the first buffer layer and is more than or equal to the critical integration concentration at a position of at least a peak concentration in the second buffer layer.

5. The semiconductor device according to claim 1, wherein an impurity concentration of the second buffer layer is more than or equal to 2E16 $cm^{-3}$.

6. The semiconductor device according to claim 1, wherein a depth of the peak concentration of the second buffer layer from the back surface is 2 μm or less.

7. The semiconductor device according to claim 1, wherein a minimum value of an impurity concentration of the first buffer layer and the second buffer layer is more than or equal to an impurity concentration of the drift layer.

8. The semiconductor device according to claim 1, wherein a donor concentration of a region of the first buffer layer from the peak position to 0.3 Xb toward the back surface is more than or equal to 10% of a peak concentration of the first buffer layer.

9. The semiconductor device according to claim 1, wherein an impurity concentration of the drift layer is 3E13 to 3E14 cm$^{-3}$, and
a peak position of the first buffer layer is present in in a range from 15 to 25 μm.

10. The semiconductor device according to claim 1, wherein an impurity concentration of the drift layer is 1E12 to 3E13 cm$^{-3}$, and
a peak position of the first buffer layer is present in a range from 20 to 30 μm.

11. A manufacturing method of the semiconductor device according to claim 1, comprising:
injecting an impurity into the back surface of the semiconductor substrate to form the second diffusion layer;
injecting a proton into a space between the drift layer and the second diffusion layer to form the first buffer layer;
injecting an impurity into a space between the first buffer layer and the second diffusion layer to form the second buffer layer;
activating the second diffusion layer and the second buffer layer by laser heat; and
forming the first buffer layer into a donor layer by furnace anneal,
wherein a temperature of the furnace anneal is 400 to 450° C., and process time of the furnace anneal is two hours or longer.

12. The manufacturing method of the semiconductor device according to claim 11, wherein when an impurity concentration of the semiconductor substrate is 3E13 to 3E14 cm$^{-3}$, a range of the proton is 15 to 25 μm, and
when an impurity concentration of the semiconductor substrate is 1E12 to 3E13 cm$^{-3}$, a range of proton is 20 to 30 μm.

13. A manufacturing method of the semiconductor device according to claim 1, comprising:
injecting an impurity into the back surface of the semiconductor substrate to form the second diffusion layer;
injecting a proton into a space between the drift layer and the second diffusion layer to form the first buffer layer;
injecting an impurity into a space between the first buffer layer and the second diffusion layer to form the second buffer layer;
activating the second diffusion layer and the second buffer layer by laser heat; and
forming the first buffer layer into a donor layer by furnace anneal,
wherein a temperature of the furnace anneal is 410 to 450° C., and process time of the furnace anneal is one hour or longer.

14. The manufacturing method of the semiconductor device according to claim 13, wherein when an impurity concentration of the semiconductor substrate is 3E13 to 3E14 cm$^{-3}$, a range of the proton is 15 to 25 μm, and
when an impurity concentration of the semiconductor substrate is 1E12 to 3E13 cm$^{-3}$, a range of proton is 20 to 30 μm.

* * * * *